(12) United States Patent
McCarthy et al.

(10) Patent No.: US 6,392,251 B1
(45) Date of Patent: May 21, 2002

(54) TEST STRUCTURES FOR IDENTIFYING OPEN CONTACTS AND METHODS OF MAKING THE SAME

(75) Inventors: Michael McCarthy, Red Rock; David Cooper, Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/690,780

(22) Filed: Oct. 17, 2000

(51) Int. Cl.$^7$ .......................... H01L 23/58; H01L 29/00

(52) U.S. Cl. ........................................ 257/48; 257/536

(58) Field of Search .......................... 257/48, 536, 537, 257/538

(56) References Cited

U.S. PATENT DOCUMENTS

| | | | | |
|---|---|---|---|---|
| 4,347,479 A | * | 8/1982 | Cullet | 324/64 |
| 5,563,517 A | * | 10/1996 | Biery et al. | 324/613 |
| 6,007,405 A | * | 12/1999 | Mei | 451/5 |
| 6,080,597 A | * | 6/2000 | Moon | 438/17 |

OTHER PUBLICATIONS

Stanley Wolf and Richard N. Tauber; *Silicon Processing for the VLSI Era, vol. 2—Process Integration*; pp. 87–110; 1990.

* cited by examiner

Primary Examiner—Ngân V. Ngô
(74) Attorney, Agent, or Firm—Timothy M. Honeycutt

(57) ABSTRACT

Various methods of inspecting a workpiece for residue are provided. In one aspect, a test structure is provided that includes a substrate, a first conductor on the substrate and a second conductor on the substrate. A resistor network is coupled in parallel between the first conductor and the second conductor. The resistor network has n resistors and n contacts and a measurable resistance $R_M$. Each of the n resistors has a known resistance $R_k$ and a known position on the substrate. Each of the n contacts is connected between one of the n resistors and the first conductor or the second conductor, whereby the location of any of the n contacts in an open state is determined from the equation:

$$R_M = \frac{1}{\frac{1}{R_k} + \ldots \frac{1}{R_n}}$$

The test structure provides for not only the identity but also the location of open contacts.

28 Claims, 3 Drawing Sheets

TEST STRUCTURES FOR IDENTIFYING OPEN CONTACTS AND METHODS OF MAKING THE SAME

BACKGROUND OF THE INVENTION

1. Field of the Invention

This invention relates generally to semiconductor processing, and more particularly to test structures operable to identify open contacts on a semiconductor workpiece.

2. Description of the Related Art

Large scale integrated circuits now routinely contain millions of individual transistors and other electronic components. Most of the interconnections for the numerous individual components are provided via one or more metallization layers that serve as global interconnect levels. Each metallization layer is ordinarily deposited on the substrate of the integrated circuit as a single continuous layer that is thereafter patterned lithographically and etched to remove metal from areas where metal lines are not required.

A method frequently employed to form contact structures involves a damascene process in which the substrate containing the integrated circuit is coated with a layer of dielectric material that is lithographically patterned and etched to form contacts or vias in the dielectric layer where the contact structures will be formed. Thereafter, the contact material or materials if a laminate structure is desired are deposited over the dielectric layer. The goal of the deposition process is to fill the vias as completely as possible. Finally, a planarization process is performed to remove the excess conducting material from the dielectric layer and leave only the filled vias.

Oxides of silicon are commonly used as interlevel dielectric layer materials. Where materials that exhibit relatively poor adhesion to oxides, such as tungsten, are utilized for the contacts, the deposition of an adhesion film that exhibits acceptable adhesion to both oxide and the contact material is first deposited followed by the deposition of the bulk conducting material. Thereafter, the planarization process is performed to remove the portions of the deposited conducting films overlying the interlevel dielectric layer and to leave conducting material only in the contacts.

Like many aspects of modern semiconductor fabrication, quality control in the formation of contact structures is vital to device operation and productive manufacturing yields. As the fabrication of contacts involves several sequentially performed processing steps, a number of mechanisms arise that may interfere with the successful fabrication of the contacts and lead to open contacts that do not make a complete circuit. Examples of potential process mechanisms that may lead to contact failure are legion, and includes such things as line scumming, poor contact etching, particulate contamination in contacts, and poor reticle design to name just a few.

Conventional techniques for diagnosing potential causes for contact failure do not enable the process engineer to rapidly zero in on the locations and potential causes of defective contacts. One conventional method involves the complete electrical test of an entire chip or die for electrical defects. This test involves an electrical diagnostic of the active circuit structures on a given chip and may include electrical examination of various test circuit structures that are fabricated on the die. The difficulty with this approach is not only the time consuming nature of the diagnostic test but also the potential inability to accurately: (1) identify defective contacts; and (2) the likely cause of the contact defects. In some cases a region of the die that is exhibiting electrical failure undergoes a diagnostic technique known as deprocessing. The suspect area of the die is examined in more detail, often using visual inspection of die cross-sections. Using the visual inspection as a guide, the process steps leading up to the formation of the structure in question are closely examined for possible sources of process variations or other mechanisms that lead to contact failure.

The present invention is directed to overcoming or reducing the effects of one or more of the foregoing, disadvantages.

SUMMARY OF THE INVENTION

In accordance with one aspect of the present invention, a test structure is provided that includes a substrate, a first conductor on the substrate and a second conductor on the substrate. A resistor network is coupled in parallel between the first conductor and the second conductor. The resistor network has n resistors and n contacts and a measurable resistance $R_M$. Each of the n resistors has a known resistance $R_k$ and a known position on the substrate. Each of the n contacts is connected between one of the n resistors and the first conductor or the second conductor, whereby the location of any of the n contacts in an open state is determined from the equation:

$$R_M = \frac{1}{\frac{1}{R_k} + \cdots \frac{1}{R_n}}$$

In accordance with another aspect of the present invention, a test structure is provided that includes a substrate, a first conductor on the substrate, a second conductor on the substrate and n contacts connected in series between the first conductor and the second conductor and defining n/2 pairs of the n contacts. Each of the n contacts has a known resistance $R_c$. A plurality of resistors is provided. Each of the plurality of resistors has a known resistance $R_k$ and a known position on the substrate and is connected in parallel with one of the n/2 pairs of n contacts. The n contacts and the plurality of resistors have a combined measurable resistance $R_M$, whereby the location of any of the n contacts in an open state is determined from the equation:

$$R_M = \sum_{K=1}^{n} \frac{2R_c R_K}{2R_c + R_K}$$

In accordance with another aspect of the present invention, an integrated circuit is provided that includes a substrate, a plurality of circuit devices on the substrate, a plurality of active contacts coupled to the plurality of circuit devices, and a test structure. The test structure has a first conductor on the substrate, a second conductor on the substrate, and a resistor network coupled in parallel between the first conductor and the second conductor. The resistor network has n resistors and n contacts and a measurable resistance $R_M$. Each of the n resistors has a known resistance $R_k$ and a known position on the substrate. Each of the n contacts is connected between one of the n resistors and the first conductor or the second conductor, whereby the location of any of the n contacts in an open state is determined from the equation:

$$R_M = \cfrac{1}{\cfrac{1}{R_k} + \cdots \cfrac{1}{R_n}}$$

In accordance with another aspect of the present invention, an integrated circuit is provided that includes a substrate, a plurality of circuit devices on the substrate, a plurality of active contacts coupled to the plurality of circuit devices, and a test structure. The test structure has a first conductor on the substrate, a second conductor on the substrate and n contacts connected in series between the first conductor and the second conductor and defining n/2 pairs of the n contacts. Each of the n contacts has a known resistance $R_c$. A plurality of resistors is provided. Each of the plurality resistors has a known resistance $R_k$ and a known position on the substrate and is connected in parallel with one of the n/2 pairs of n contacts. The n contacts and the plurality of resistors having a combined measurable resistance $R_M$, whereby the location of any of the n contacts in an open state is determined from the equation:

$$R_M = \sum_{K=1}^{n} \frac{2R_c R_K}{2R_c + R_K}$$

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
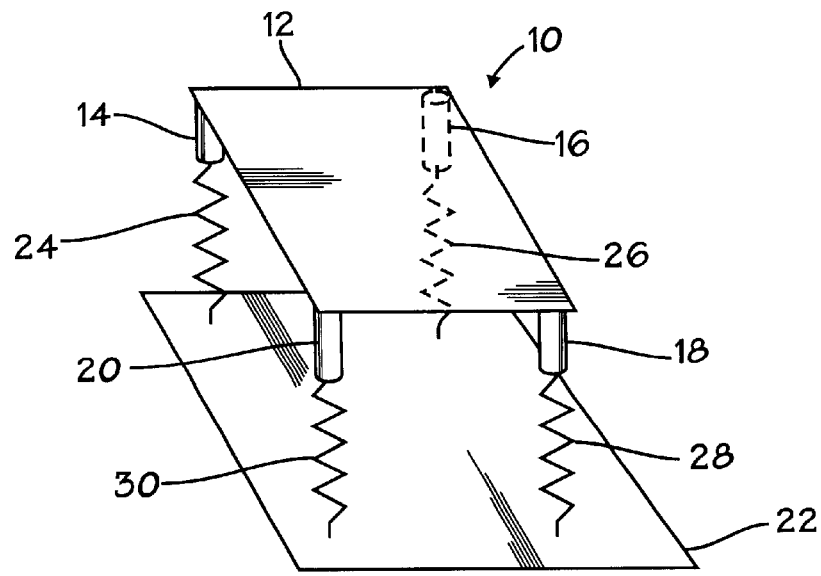
FIG. 1 is a schematic view of an exemplary embodiment of a test structure that is suitable for identifying open contacts in accordance with the present invention.

In the drawings described below, reference numerals are generally repeated where identical elements appear in more than one figure. FIG. 1 is a schematic view of an exemplary embodiment of a test structure 10 that is suitable for identifying open contacts in accordance with the present invention. The test structure 10 includes a conductor 12, a plurality of contacts 14, 16, 18 and 20 connected to the conductor 12, and another conductor 22. A resistor network is provided consisting of a plurality of resistors 24, 26, 28 and 30.

Each of the plurality of resistors 24, 26, 28 and 30 is respectively connected in parallel between one of the plurality of contacts 14, 16, 18 and 20 and the conductor 22. The resistors 24, 26, 28 and 30 have respective known resistances $R_{24}$, $R_{26}$, $R_{28}$ and $R_{30}$ and positions.

A calculated resistance $R_{CALCULATED}$ between the conductors 12 and 22 is given by the following equation:

$$R_{CALCULATED} = \cfrac{1}{\cfrac{1}{R_{24}} + \cfrac{1}{R_{26}} + \cfrac{1}{R_{28}} + \cfrac{1}{R_{30}}} \qquad \text{Equation 1}$$

If none of the contacts 14, 16, 18 and 20 is in an open state, then a measured resistance $R_M$ between the conductors 12 and 22 will be equal to the calculated resistance $R_{CALCULATED}$. Thus, $$R_M = R_{CALCULATED} = \cfrac{1}{\cfrac{1}{R_{24}} + \cfrac{1}{R_{26}} + \cfrac{1}{R_{28}} + \cfrac{1}{R_{30}}} \qquad \text{Equation 2}$$

Since the resistances $R_{24}$, $R_{26}$, $R_{28}$ and $R_{30}$ and locations of each of the resistors 24, 26, 20 28 and 30 are known, Equation 2 may be used to determine the location of any of the contacts 14, 16, 18 or 20 that is in an open state. For example, assume that the contact 20 is in an open state and the resistance between the conductors 12 and 22 is measured to yield a measured resistance $R_M$. In this circumstance, the resistor 28 does not contribute to the measured resistance $R_M$ and the measure resistance $R_M$ is not equal to the calculated theoretical resistance $R_{CALCULATED}$. The identity of the open contact 20 may be ascertained by setting the right side of Equation 2 equal to $R_M$ and trying various combinations of the known resistances $R_{24}$, $R_{26}$, $R_{28}$ and $R_{30}$ until the calculated equivalent resistance $R_{CALCULATED}$ matches the measured resistance $R_M$. In this example, the combination of the known resistances $R_{24}$, $R_{26}$ and $R_{30}$ in the right side of Equation 2 produces a match with the measure resistance $R_M$.

Equation one presents the case of four resistors in the resistor network. However, the more general form of equation one for n resistors is given by the following equation:

$$R_M = \cfrac{1}{\cfrac{1}{R_k} + \cdots \cfrac{1}{R_n}} \qquad \text{Equation 3}$$

Thus, for a resistor network that has n resistors and n contacts, the locations of any contacts in an open state may be determined by performing the aforementioned trial and error substitutions in the right side of the Equation 3 until a match with the measured resistance $R_M$ is reached.

For a given set of n resistors, the smallest resistance value is $R_l$. If desired, the resistances of the other n-1 resistors may have values that are integer multiples of the lowest resistance value $R_l$. This might desirable in circumstances where simplified arithmetic is desirable, such as where the trial and error calculations of Equation 3 will be made without the aid of a computing device. For example, a four resistor network may be fabricated with resistances $R_l$, $10R_l$, $20R_l$ and $30R_l$.

Figure 2:
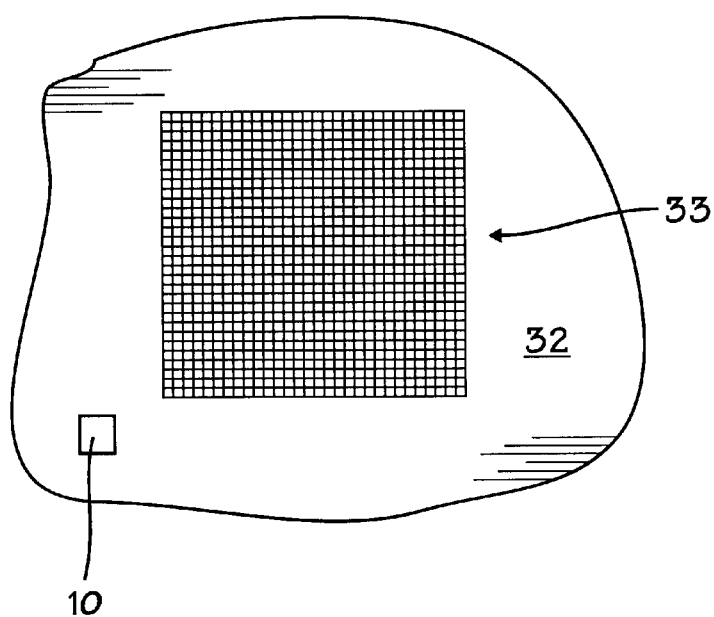
FIG. 2 is a plan view of a portion of a semiconductor workpiece or substrate with the test structure of FIG. 1 implemented thereon in accordance with the present invention.
Figure 3:
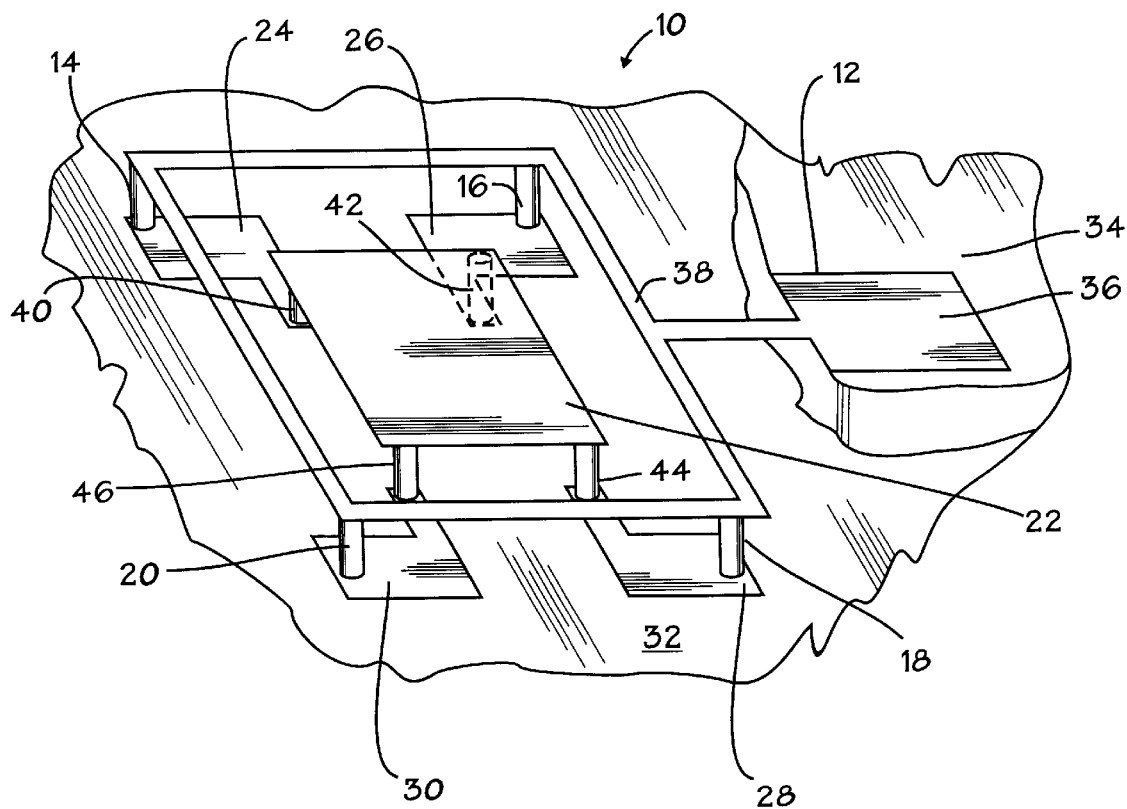
FIG. 3 is a magnified pictorial view of the test structure implemented on the substrate of FIG. 2 in accordance with the present invention.

An exemplary physical implementation of the test structure 10 on a semiconductor substrate 32, such as a semiconductor wafer or other type of substrate, may be understood by referring now to FIGS. 2 and 3. FIG. 2 depicts a plan view of a portion of a semiconductor workpiece or substrate 32 and FIG. 3 depicts a magnified pictorial view of the test structure 10 implemented on the substrate 32. Note that the test structure 10 may be implemented on the substrate 32 in conjunction with other active circuitry 33 or as an application specific circuit as desired. The substrate 32 may be composed of n-doped silicon, p-doped silicon, silicon-on-insulator or other suitable substrate materials. The resistors 24, 26, 28 and 30 consist of impurity regions formed in the substrate 32. An insulating layer 34, such as an interlevel dielectric layer, is formed on the substrate 32. The layer 34 may be composed of silicon dioxide, tetra-ethyl-ortho-silicate ("TEOS"), or other suitable interlevel dielectric materials. If TEOS is selected, the layer 34 may be formed by CVD or like techniques. The interlevel dielectric layer 34 may be about 0.75 μm to 1.2 μm thick and is advantageously about 1.0 μm thick. Follow deposition, the layer 34 is planarized to the desired thickness by chemical-mechanical-polishing ("CMP") or other planarization techniques. Note that the layer 34 is shown peeled back significantly in order to reveal the details of the test structure 10.

The contacts 14, 16, 18 and 20 are formed in the insulating layer 34 using well known via or contact etching and conductor deposition techniques. One of the desirable of features of the test structure 10 is a close mimicry of the characteristics of contacts used for active circuits. Accordingly, the contacts 14, 16, 18 and 20 are advantageously formed from the same materials and using the same processes as those used for contacts in the active circuitry 33. In an exemplary embodiment, the contacts 14, 16, 18 and 20 consist of a tungsten plug surrounded by a titanium nitride adhesion layer.

The conductor 12 consists of a test pad 36 and a conductor line 38 that is connected to the contacts 14, 16, 18 and 20. The conductor 22 is similarly configured as a test pad. The conductors 12 and 22 may be fabricated from a myriad of conducting materials commonly used in semiconductor fabrication, such as, for example, aluminum, titanium, refractory metals, refractory metal silicides, copper, laminates of these or the like. In an exemplary embodiment, the conductors 12 and 22 consist of a titanium/aluminum stack.

Ohmic connection between the resistors 24, 26, 28 and 30 and the conductor 22 is established by a second plurality of contacts 40, 42, 44 and 46 that are partially obscured by the conductor 22 in FIG. 3, and thus are shown in phantom. The contacts 40, 42, 44 and 46 may be substantially identical to the contacts 14, 16, 18 and 20. The conductors 12 and 22, as well as the contacts 14, 16, 18 and 20 are advantageously composed of low resistivity materials so that the known resistances $R_{24}$, $R_{26}$, $R_{28}$ and $R_{30}$ are considerably greater than the resistances of the conductors 12, 22 and the various contacts 14, 16, 18, 20, 40, 42, 44 and 46. Thus, the resistances of the conductors 12, 22 and the contacts 14, 16, 18, 20, 40, 42, 44 and 46 may be ignored in Equation 2 and Equation 3 above.

Figure 4:
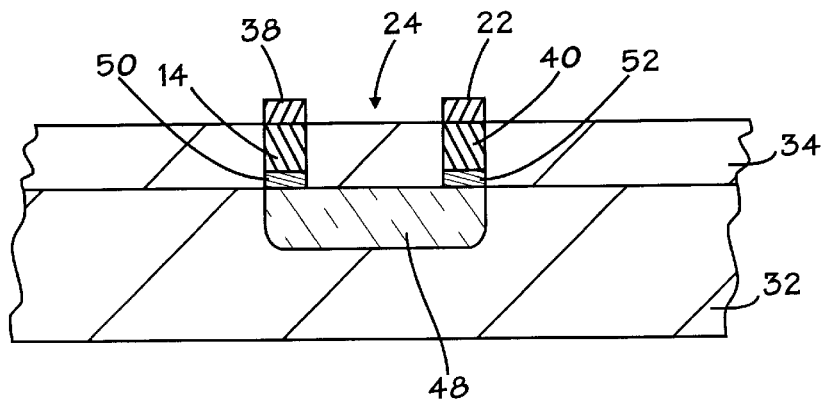
FIG. 4 is a cross-sectional view of an exemplary embodiment of a resistor of the test structure in accordance with the present invention.
Figure 5:
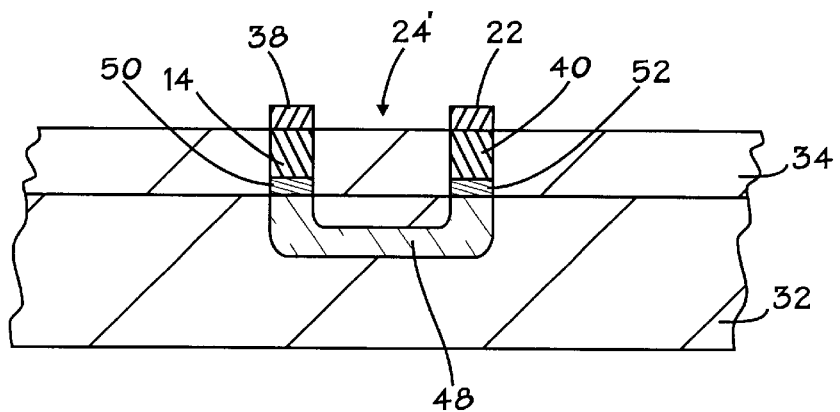
FIG. 5 is a cross-sectional view of another exemplary embodiment of a resistor of the test structure in accordance with the present invention.

The resistors 24, 26, 28 and 30 may be implemented in a variety of well known ways. The following description will focus on the resistor 24. However, the description is illustrative of the other resistors 26, 28 and 30. FIGS. 4 and 5 depict cross-sectional views of two exemplary implementations of the resistor 24. The view is taken at a section that presents both the contact 14 and the contact 40 as visible structures. Referring first to FIG. 4, the resistor 24 may consist of an impurity region 48 formed in the substrate 32. The impurity region 48 will have a conductivity type, e.g., n-type or p-type, that is opposite to the conductivity type of the substrate 32. Self-aligned silicide structures 50 and 52 may be provided below the contacts 14 and 40 as desired. A suitable silicide forming material, such as cobalt, titanium, platinum, palladium, nickel, tungsten, tantalum, molybdenum, or the like may be deposited on the substrate 32 by PVD or CVD. The silicide forming material is then annealed in an inert ambient to initiate a reaction with the silicon. A two stage anneal may be performed if desired with a cleaning step performed after the first anneal stage.

The resistor 24 may be provided with a known resistance using well known techniques for fabricating an impurity region. For example, ion implantation may be used to establish an impurity region with dopant atoms having a mobility $\mu_L$, a carrier concentration $n_L$, and a uniform doping depth $R_p$. The sheet resistance per unit area $R_s$ of the thus formed resistor 24 will be given by the equation:

$$R_S = \frac{1}{cn_L R_p \mu_L} \qquad \text{Equation 4}$$

where c is the fundamental unit of charge. For example, in an exemplary embodiment, arsenic may be implanted with a dosage of 10E14 cm$^{-2}$ to a uniform doping depth $R_p$ of 10$^{-5}$ cm. Assuming a mobility $\mu_L$ of 100 cm$^2$sV$^{-1}$, Equation 4 yields a sheet resistance $R_s$ of about 624.2 Ω/unit area.

It is anticipated that an activating anneal at about 100° C. for 30 minutes will not significantly change the location of the peak concentration or the straggle. It is anticipated that the rapid thermal anneal will produce even less impact on the diffusion of the implanted dopant atoms.

An alternate implementation of the resistor, now designated 24', may be understood by referring to FIG. 5. In this illustrative embodiment, an impurity region 54 is superimposed on the impurity region 48. The impurity region 54 will share the same conductivity type with the substrate 32 but not with the impurity region 48. Salicide structures 50 and 52 may be provided beneath the contacts 14 and 40 as described above.

Figure 6:
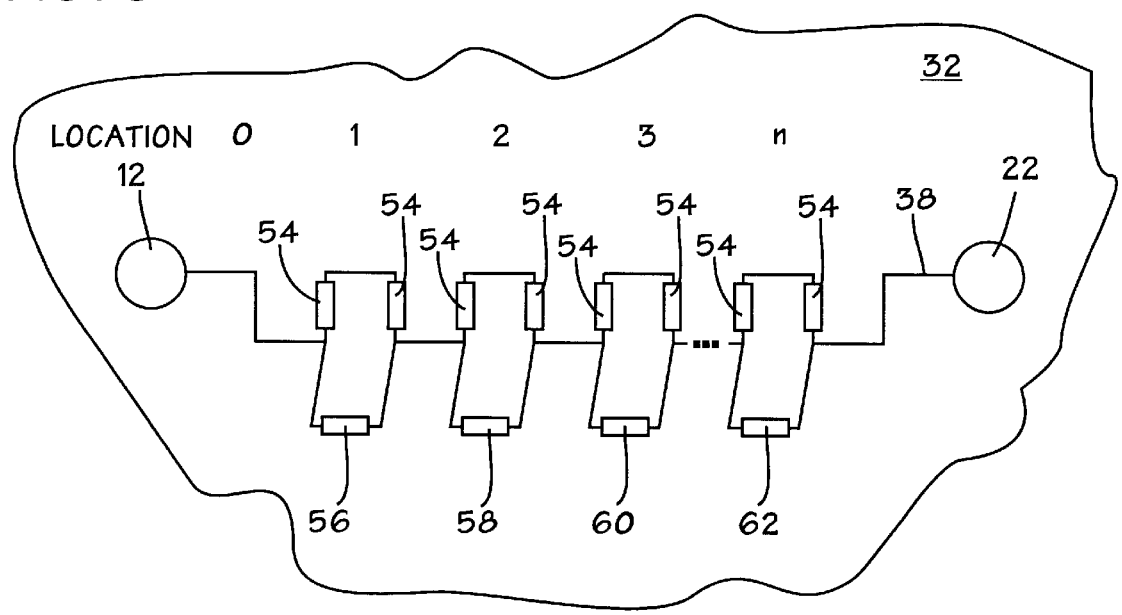
FIG. 6 is a schematic view of an alternate exemplary embodiment of a test structure that is suitable for identifying open contacts in accordance with the present invention.

An alternate exemplary embodiment of the test structure, now designated 10', may be understood by referring now to FIG. 6, which is a schematic view of the test structure 10'. While the foregoing illustrative embodiment incorporated a parallel connected test structure, the alternate embodiment depicted in FIG. 6 utilizes a serial test structure. Like the test structure 10 depicted in FIG. 1, the test structure 10' depicted in FIG. 6 includes the conductors 12 and 22. A resistor/contact network is connected in series between the conductors 12 and 22. A plurality of contacts, collectively designated 54 is connected in series between the conductors 12 and 22. Each of the contacts 54 is fabricated with a known resistance $R_c$. Pairs of the contacts 54 are associated with known locations 0, 1, 2, 4 . . . n on the substrate 32. Each pair of contacts 54 is provided with a by-pass resistor 56, 58, 60 and 62. Each of the by-pass resistors 56, 58, 60 and 62 is fabricated with a known resistance $R_1$, $R_2$, $R_3$ . . . $R_n$.

The calculated resistance $R_{CALCULATED}$ between the conductors 12 and 22 is given by the following equation:

$$R_{CALCULATED} = \sum_{K=1}^{n} \frac{2R_c}{2R_c + R_K} \qquad \text{Equation 4}$$

The resistance $R_c$ of each contact 54 is substantially less than the resistance of each of the by-pass resistors 56, 58, 60 and 62. Accordingly, if none of the contacts 54 is in an open state, the calculated resistance between the conductors 12 and 22 simplifies to:

$$R_M = 2nR_c \qquad \text{Equation 5}$$

However, if one or more of the contacts 54 is in an open state, the by-pass resistor associated with the location of the open contact will contribute to the measured resistance $R_M$ between the conductors 12 and 22. In this circumstance, the location of the open contact can be determined by setting the right side of Equation 4 equal to $R_M$ and using trial and error substitution of the resistance values $R_C$ and $R_K$ into the right side of Equation 4 until the calculated equivalent resistance $R_{CALCULATED}$ matches the measured resistance $R_M$.

As with the test structure 10, the test structure 10' may be implemented such that the resistances of the resistors in the network are integer multiples of the fundamental resistance value of the network.

The test structure 10' may be implemented on the substrate 32 the same general manner as the test structure 10 depicted in FIGS. 1–5 above, albeit with serial as opposed to parallel connections. Similarly, the by-pass resistors 56, 58, 60 and 62 may be fabricated using the aforementioned resistor fabrication techniques. The skilled artisan will appreciate that the number of by-pass resistors in the test structure 10' is largely a matter of design discretion.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A test structure, comprising:
   a substrate;
   a first conductor on the substrate;
   a second conductor on the substrate; and
   a resistor network coupled in parallel between the first conductor and the second conductor, the resistor network having n resistors and n contacts and a measurable resistance $R_M$, each of the n resistors having a known resistance $R_k$ and a known position on the substrate, each of the n contacts being connected between one of the n resistors and the first conductor or the second conductor, whereby the location of any of the n contacts in an open state is determined from the equation:

$$R_M = \frac{1}{\frac{1}{R_k} + \cdots \frac{1}{R_n}}.$$

2. The test structure of claim 1, wherein $R_l$ is the lowest resistance of the known resistances $R_k \ldots R_n$ and the known resistances $R_k \ldots R_n$ are integer multiples of $R_l$.

3. The test structure of claim 1, wherein the contacts comprises tungsten contacts.

4. The test structure of claim 1, wherein the n resistors comprise impurity regions in the substrate.

5. The test structure of claim 1, comprising an insulating film on the substrate having a plurality of openings, each of the n resistors being in one of the plurality of openings.

6. The test structure of claim 5, wherein the first conductor comprises a first test pad and the second comprises a second test pad.

7. The test structure of claim 6, wherein the first and second test pads are positioned on the insulating layer.

8. A test structure, comprising:
   a substrate;
   a first conductor on the substrate;
   a second conductor on the substrate;
   n contacts connected in series between the first conductor and the second conductor and defining n/2 pairs of the n contacts, each of the n contacts having a known resistance Rc; and
   a plurality of resistors, each of the plurality resistors having a known resistance $R_k$ and a known position on the substrate and being connected in parallel with one of the n/2 pairs of n contacts, the n contacts and the plurality of resistors having a combined measurable resistance $R_M$, whereby the location of any of the n contacts in an open state is determined from the equation:

$$R_M = \sum_{K=1}^{n} \frac{2R_c R_K}{2R_c + R_K}.$$

9. The test structure of claim 8, wherein $R_l$ is the lowest resistance of the known resistances $R_k \ldots R_n$ and the known resistances $R_k \ldots R_n$ are integer multiples of $R_l$.

10. The test structure of claim 8, wherein the n contacts comprises tungsten contacts.

11. The test structure of claim 8, wherein the plurality of resistors comprise impurity regions in the substrate.

12. The test structure of claim 8, comprising an insulating film on the substrate having a plurality of openings, each of the n contacts being in one of the plurality of openings.

13. The test structure of claim 12, wherein the first conductor comprises a first test pad and the second comprises a second test pad.

14. The test structure of claim 13, wherein the first and second test pads are positioned on the insulating layer.

15. An integrated circuit, comprising:
   a substrate;
   a plurality of circuit devices on the substrate;
   a plurality of active contacts coupled to the plurality of circuit devices; and
   a test structure having a first conductor on the substrate, a second conductor on the substrate, and a resistor network coupled in parallel between the first conductor and the second conductor, the resistor network having n resistors and n contacts and a measurable resistance $R_M$, each of the n resistors having a known resistance $R_k$ and a known position on the substrate, each of the n contacts being connected between one of the n resistors and the first conductor or the second conductor, whereby the location of any of the n contacts in an open state is determined from the equation:

$$R_M = \frac{1}{\frac{1}{R_k} + \cdots \frac{1}{R_n}}.$$

16. The test structure of claim 15, wherein R. is the lowest resistance of the known resistances $R_k \ldots R_n$ and the known resistances $R_k \ldots R_n$ are integer multiples of $R_l$.

17. The integrated circuit of claim 15, wherein the n contacts comprises tungsten contacts.

18. The test structure of claim 15, wherein the n resistors comprise impurity regions in the substrate.

19. The test structure of claim 15, comprising an insulating film on the substrate having a plurality of openings, each of the n resistors being in one of the plurality of openings.

20. The test structure of claim 19, wherein the first conductor comprises a first test pad and the second comprises a second test pad.

21. The test structure of claim 20, wherein the first and second test pads are positioned on the insulating layer.

22. An integrated circuit, comprising:

a substrate;

a plurality of circuit devices on the substrate;

a plurality of active contacts coupled to the plurality of circuit devices; and a test structure having a first conductor on the substrate, a second conductor on the substrate, n contacts connected in series between the first conductor and the second conductor and defining n/2 pairs of the n contacts, each of the n contacts having a known resistance Rc, a plurality of resistors, each of the plurality resistors having a known resistance $R_k$ and a known position on the substrate and being connected in parallel with one of the n/2 pairs of n contacts, the n contacts and the plurality of resistors having a combined measurable resistance $R_M$, whereby the location of any of the n contacts in an open state is determined from the equation:

$$R_M = \sum_{K=1}^{n} \frac{2R_c R_K}{2R_c + R_K}.$$

23. The test structure of claim 22, wherein $R_l$ is the lowest resistance of the known resistances $R_k \ldots R_n$ and the known resistances $R_k \ldots R_n$ are integer multiples of $R_l$.

24. The test structure of claim 22, wherein the n contacts comprises tungsten contacts.

25. The test structure of claim 22, wherein the plurality of resistors comprise impurity regions in the substrate.

26. The test structure of claim 22, comprising an insulating film on the substrate having a plurality of openings, each of the n contacts being in one of the plurality of openings.

27. The test structure of claim 26, wherein the first conductor comprises a first test pad and the second comprises a second test pad.

28. The test structure of claim 27, wherein the first and second test pads are positioned on the insulating layer.

* * * * *

UNITED STATES PATENT AND TRADEMARK OFFICE
CERTIFICATE OF CORRECTION

PATENT NO. : 6,392,251 B1
DATED : May 21, 2002
INVENTOR(S) : Michael McCarthy et al.

It is certified that error appears in the above-identified patent and that said Letters Patent is hereby corrected as shown below:

Column 6,
Line 22, delete "100" and substitute -- 1000 -- therefor.

Column 8,
Line 55, delete "R," and substitute -- $R_1$ -- therefor.

Signed and Sealed this

Nineteenth Day of November, 2002

Attest:

JAMES E. ROGAN
Attesting Officer
Director of the United States Patent and Trademark Office